US012796337B2

(12) United States Patent
Lee et al.

(10) Patent No.: US 12,796,337 B2
(45) Date of Patent: Nov. 10, 2026

(54) NONVOLATILE MEMORY DEVICE

(71) Applicant: Samsung Electronics Co., Ltd., Suwon-si (KR)

(72) Inventors: Kilho Lee, Suwon-si (KR); Dahye Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 171 days.

(21) Appl. No.: 18/531,200

(22) Filed: Dec. 6, 2023

(65) Prior Publication Data

US 2024/0389470 A1 Nov. 21, 2024

(30) Foreign Application Priority Data

May 16, 2023 (KR) ........................ 10-2023-0063249

(51) Int. Cl.

| | |
|---|---|
| ***H10N 50/80*** | (2023.01) |
| ***G11C 11/16*** | (2006.01) |
| ***H10B 61/00*** | (2023.01) |
| ***H10N 50/10*** | (2023.01) |

(52) U.S. Cl.

CPC ........... *H10N 50/80* (2023.02); *G11C 11/161* (2013.01); *G11C 11/1655* (2013.01); *G11C 11/1657* (2013.01); *G11C 11/1659* (2013.01); *G11C 11/1673* (2013.01); *G11C 11/1675* (2013.01); *H10B 61/22* (2023.02); *H10N 50/10* (2023.02)

(58) Field of Classification Search

CPC ........ H10N 50/80; H10N 50/10; H10N 59/00; G11C 11/161; G11C 11/1655; G11C 11/1657; G11C 11/1659; G11C 11/1673; G11C 11/1675; H10B 61/22; H10B 61/10

See application file for complete search history.

(56) References Cited

U.S. PATENT DOCUMENTS

| | | | | |
|---|---|---|---|---|
| 6,963,500 | B2 | 11/2005 | Tsang | |
| 8,699,255 | B2 * | 4/2014 | Yu | G11C 11/4097 365/230.03 |
| 8,865,481 | B2 | 10/2014 | Li et al. | |
| 9,152,827 | B2 * | 10/2015 | Linderman | G06N 3/044 |
| 9,406,351 | B2 * | 8/2016 | Stansfield | G11C 11/419 |
| 9,614,143 | B2 | 4/2017 | Lu et al. | |
| 9,660,181 | B2 | 5/2017 | Lee et al. | |

(Continued)

FOREIGN PATENT DOCUMENTS

| | | | |
|---|---|---|---|
| KR | 2013-0111136 | A | 10/2013 |
| KR | 2018-0086375 | A | 7/2018 |

*Primary Examiner* — Tuan D Nguyen

(74) *Attorney, Agent, or Firm* — Harness, Dickey & Pierce, P.L.C.

(57) ABSTRACT

Provided is a nonvolatile memory device equipped with an information storage device with improved reliability. The nonvolatile memory device includes a substrate in which a cell area and a peripheral area are defined, a multi-wire layer disposed on the cell area and the peripheral area and including metal wires of a multilayer, and an information storing layer including a plurality of information storage devices arranged on the multi-wire layer of the cell area in a two-dimensional array structure, in which a first metal wire arranged in an uppermost portion of the multi-wire layer of the peripheral area is located at a level lower than a level of a second metal wire arranged in an uppermost portion of the multi-wire layer of the cell area.

20 Claims, 12 Drawing Sheets

(56) References Cited

U.S. PATENT DOCUMENTS

| | | | | |
|---|---|---|---|---|
| 9,947,399 | B2 * | 4/2018 | Navon ................ | G06F 11/1048 |
| 9,947,401 | B1 * | 4/2018 | Navon ................ | G06F 11/3034 |
| 9,972,775 | B2 | 5/2018 | Shum et al. | |
| 10,319,784 | B2 | 6/2019 | Lee et al. | |
| 10,643,705 | B2 * | 5/2020 | Choi .................... | G06N 3/0495 |
| 10,699,761 | B2 * | 6/2020 | Berger ................ | G11C 11/1657 |
| 11,393,873 | B2 | 7/2022 | Lee et al. | |
| 11,526,285 | B2 * | 12/2022 | Wang ................... | G06N 3/0464 |
| 2011/0302354 | A1 * | 12/2011 | Miller .................... | G11C 16/22<br>711/E12.001 |
| 2013/0135925 | A1 * | 5/2013 | Scheuerlein ....... | G11C 13/0069<br>365/163 |

* cited by examiner

NONVOLATILE MEMORY DEVICE

CROSS-REFERENCE TO RELATED APPLICATION

This application is based on and claims priority under 35 U.S.C. § 119 to Korean Patent Application No. 10-2023-0063249, filed on May 16, 2023, in the Korean Intellectual Property Office, the disclosure of which is incorporated by reference herein in its entirety.

BACKGROUND

The inventive concept relates to a memory device, and more particularly, to a nonvolatile memory device equipped with a resistive information storage device.

As semiconductor products have become miniaturized, highly integrated, and multi-functional, high-capacity data processing is required in a small area. Accordingly, research on devices capable of miniaturizing patterns for high integration while increasing the operation speed of memory devices used in semiconductor products, is required. Recently, magnetic random access memory (MRAM), phase-change RAM (PRAM), ferroelectric RAM (FRAM), resistive RAM (ReRAM), and the like are highlighted as next-generation memory devices capable of satisfying requirements for high speed, low power consumption, high integration, and the like.

SUMMARY

Various embodiments described herein provide a nonvolatile memory device equipped with an information storage device with improved reliability.

Furthermore, the technical objectives to be achieved by the disclosure are not limited to the above-described objective, and other technical objectives that are not mentioned herein would be clearly understood by a person skilled in the art from the description of the disclosure.

According to at least one embodiment, there is provided a nonvolatile memory device including a substrate in which a cell area and a peripheral area are defined, a multi-wire layer disposed on the cell area and the peripheral area and including metal wires of a multilayer, and an information storing layer including a plurality of information storage devices arranged on the multi-wire layer of the cell area in a two-dimensional array structure, in which a first metal wire arranged in an uppermost portion of the multi-wire layer of the peripheral area is located at a level lower than a level of a second metal wire arranged in an uppermost portion of the multi-wire layer of the cell area.

Furthermore, according to some embodiments, there is provided a nonvolatile memory device including a substrate in which a cell area and a peripheral area are defined, a multi-wire layer disposed on the cell area and the peripheral area and including metal wires of a multilayer, and an information storing layer including a plurality of information storage devices arranged on the multi-wire layer of the cell area in a two-dimensional array structure, wherein a first metal wire arranged in an uppermost portion of the multi-wire layer of the peripheral area is located at a same level as a level of a second metal wire arranged in an uppermost portion of the multi-wire layer of the cell area, and the first metal wire and a second metal wire are connected to each other by a connection metal wire at a level lower than a level of the first metal wire.

Furthermore, according to various embodiments, there is provided a nonvolatile memory device including a substrate in which a cell area and a peripheral area are defined, a multi-wire layer disposed on the cell area and the peripheral area and including metal wires of a multilayer, and an information storing layer including a plurality of information storage devices arranged on the multi-wire layer of the cell area in a two-dimensional array structure, wherein a first metal wire arranged in an uppermost portion of the multi-wire layer of the peripheral area is located at a same level as or a level lower than a level of a second metal wire arranged in an uppermost portion of the multi-wire layer of the cell area, and the first metal wire and the second metal wire are connected to each other by a separate connection metal wire, or through a third metal wire arranged directly below the second metal wire.

BRIEF DESCRIPTION OF THE DRAWINGS

Embodiments of various implementations will be more clearly understood from the following detailed description taken in conjunction with the accompanying drawings in which.

DETAILED DESCRIPTION OF THE EMBODIMENTS

Figure 1:
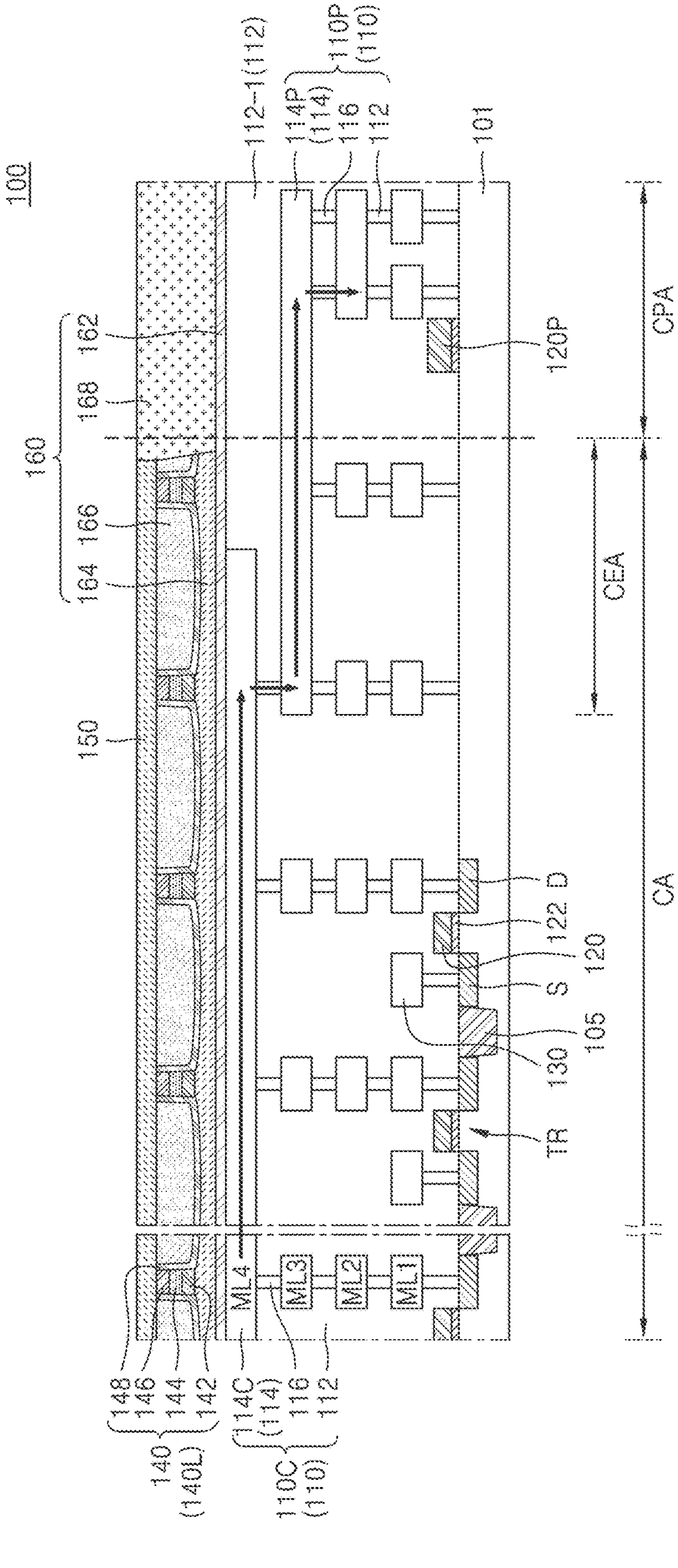
FIG. 1 is a cross-sectional view of a nonvolatile memory device according to an embodiment.

In the following description, embodiments are described in detail with reference to the accompanying drawings. Throughout the drawings, like reference numerals denote like elements, and redundant descriptions thereof are omitted.

FIG. 1 is a cross-sectional view of a nonvolatile memory device 100 according to an embodiment.

Referring to FIG. 1, the nonvolatile memory device 100 (hereinafter, briefly referred to as the memory device) according to an embodiment may include a substrate 101, a cell transistor TR, a multi-wire layer 110, a source line 130, an information storing layer 140L, and a bit line 150.

The substrate 101 may be formed of a semiconductor material. In some embodiments, the substrate 101 may include silicon (Si). In some other embodiments, the substrate 101 may include a semiconductor element such as germanium (Ge), or a compound semiconductor material, such as silicon carbide (SiC), gallium arsenide (GaAs), indium arsenide (InAs), and indium phosphide (InP). In some embodiments, the substrate 101 may have a silicon on insulator (SOI) structure. For example, the substrate 101 may include a buried oxide layer (BOX layer). In some embodiments, the substrate 101 may include a conductive area, for example, a well doped with impurities, or a structure doped with impurities.

A cell area CA and a core/periphery area CPA may be defined on the substrate 101. The information storing layer 140L may be arranged in the cell area CA. The information storing layer 140L may include a plurality of information storage devices 140 disposed on the multi-wire layer 110 in a two-dimensional array structure. The two-dimensional array arrangement structure of the information storage devices 140 is described below in detail with reference to FIGS. 2A and 2B. The core/periphery area CPA may be arranged around the cell area CA. Driving circuits for driving data write/read to/from the information storage devices 140 may be arranged in the core/periphery area CPA.

The cell transistor TR may be disposed on the substrate 101 of the cell area CA. The cell transistor TR may include a gate 120, a source region S, and a drain region D. The gate 120 may be connected to a word line, or may form a word line. Furthermore, an information storage device 140 may be connected to the drain region D, and the source line 130 may be connected to the source region S. The cell transistors TR may be electrically separated from each other by a device isolation layer 105. The device isolation layer 105 may be, for example, a shallow trench isolation (STI).

For the information storage devices 140, one end thereof may be connected to the bit line 150, and the other end thereof may be connected to the drain region D of the cell transistor TR. As illustrated in FIG. 1, one end of the information storage device 140 may be connected directly to the bit line 150. In contrast, the other end of the information storage device 140 may be connected to the drain region D of the cell transistor TR through a metal wire 114 and a vertical via 116 of the multi-wire layer 110. The connection relationships and operations of the cell transistor TR, the source line 130, the information storage device 140, and the bit line 150 are described below in detail with reference to FIGS. 2A and 2B.

The multi-wire layer 110 may be disposed on the substrate 101. The multi-wire layer 110 may include an interlayer insulating layer 112, the metal wire 114, and the vertical via 116. The interlayer insulating layer 112 may cover the structure of the substrate 101 and the metal wire 114. The interlayer insulating layer 112 may have a multilayer structure. For example, when the metal wire 114 is formed in a multilayer, the interlayer insulating layer 112 may have a multilayer structure corresponding to the multilayer of the metal wire 114. When the interlayer insulating layer 112 has a multilayer structure, the interlayer insulating layer 112 may include a single material layer or a plurality of different material layers. For example, the interlayer insulating layer 112 may include a silicon oxide film, a silicon nitride film, a silicon oxynitride film, and the like.

The metal wire 114 may be arranged in the interlayer insulating layer 112, and may be formed in a multilayer. When the metal wire 114 is formed in a multilayer structure, metal wires 114 adjacent to each other in a vertical direction may be connected to each other through the vertical via 116.

The metal wire 114 and the vertical via 116 may each include a metal. For example, the metal wire 114 and the vertical via 116 may each include a metal, such as copper (Cu), aluminum (Al), tungsten (W), nickel (Ni), or the like. In some embodiments, the metal wire 114 and the vertical via 116 may include a barrier layer and a metal layer. The barrier layer may include, for example, a metal such as Ti, Ta, Al, Ru, Mn, Co, W, and the like, a metal nitride or a metal oxide, or an alloy such as cobalt tungsten phosphide (CoWP), cobalt tungsten boron (CoWB), cobalt tungsten boron phosphide (CoWBP), and the like. Furthermore, the metal layer may include at least one of metal selected from Cu, Al, W, Ti, Ta, Ru, and Mn. In the memory device 100 according to an embodiment, the metal wire 114 may include Cu. However, the material of the metal wire 114 is not limited to Cu.

In the memory device 100 according to an embodiment, the number of layers of a metal wire 114P of a first multi-wire layer 110P of the core/periphery area CPA may be less than the number of layers of a metal wire 114C of a second multi-wire layer 110C of the cell area CA. For example, as illustrated in FIG. 1, the metal wire 114C of the cell area CA may be formed in four layers, and the metal wire 114P of the core/periphery area CPA may be formed in three layers. However, the number of layers of the metal wire 114 is not limited to the four layers of the cell area CA and the three layers of the core/periphery area CPA. According to an embodiment, the metal wire 114 may be formed in various ways, for example, three layers of the cell area CA and two layers of the core/periphery area CPA, five layers of the cell area CA and four layers of the core/periphery area CPA, or the like.

In the memory device 100 according to an embodiment, the metal wire 114C of the cell area CA may include a first metal wire ML1, a second metal wire ML2, a third metal wire ML3, and a fourth metal wire ML4, and the metal wire 114P of the core/periphery area CPA may include the first metal wire ML1, the second metal wire ML2, and the third metal wire ML3. Furthermore, in the memory device 100 according to an embodiment, the fourth metal wire ML4 of the cell area CA, and the third metal wire ML3 of the core/periphery area CPA may be used as a wire for a reference line to sense the logic state of the information storage device 140. An upper surface of the fourth metal wire ML4 of the cell area CA may be coplanar with an upper surface of an uppermost interlayer insulating layer 112-1 of the core/periphery area CPA. In FIG. 1, the fourth metal wire ML4 of the cell area CA and the third metal wire ML3 of the core/periphery area CPA are used as a wire for a reference line, which is indicated by arrows.

The third metal wire ML3 of the cell area CA may be connected to the fourth metal wire ML4 through the vertical via 116, in a cell edge area CEA, and may extend toward the core/periphery area CPA to be connected to the third metal wire ML3 of the core/periphery area CPA. The cell edge area CEA may mean an edge portion of the cell area CA adjacent to the core/periphery area CPA. Dummy information storage devices that do not operate may be arranged in the cell edge area CEA. For example, when the information storage device 140 is magnetic random access memory (MRAM), a dummy magnetic tunnel junction (MTJ) device may be arranged in the cell edge area CEA. In detail, in FIG. 1, the two information storage devices 140 on the right may correspond to the dummy information storage devices. In other words, the two information storage devices 140 on the right may include a dummy MTJ device.

As illustrated in FIG. 1, the uppermost interlayer insulating layer 112-1 of the core/periphery area CPA may extend toward the cell edge area CEA. Furthermore, some of the dummy MTJ devices may be disposed on the uppermost interlayer insulating layer 112-1 of the cell edge area CEA.

In the memory device 100 according to an embodiment, as the third metal wire ML3 is used as a wire for a reference line in the core/periphery area CPA, damage to the fourth metal wire ML4, and a sensing error according thereto, which occurs as the fourth metal wire ML4 of the core/periphery area CPA is used as a wire for a reference line according to the related art, may be prevented. The damage to the fourth metal wire ML4 of the core/periphery area CPA may occur, for example, in a process of patterning the information storage device 140 and/or in a mold replace process. The damage to the fourth metal wire ML4 of the core/periphery area CPA is described below in detail with reference to FIGS. 6A to 7. Furthermore, the sensing error according to the damage to the fourth metal wire ML4 is described below in detail with reference to FIGS. 5A and 5B.

The information storing layer 140L may be disposed on the first multi-wire layer 110C of the cell area CA. The information storing layer 140L may include the information storage devices 140 disposed on the first multi-wire layer 110C of the cell area CA in a two-dimensional array structure. The information storage device 140 may include, for example, MRAM. However, the information storage device 140 is not limited to MRAM. For example, according to an embodiment, the information storage device 140 may include phase-change RAM (PRAM), ferroelectric RAM (FRAM), resistive RAM (ReRAM), or the like. In the MRAM, PRAM, FRAM, ReRAM, or the like, a resistance value of a resistance layer may be changed by changing material characteristics of the resistance layer through application of a voltage or current thereto. Changing the resistance value of a resistance layer through the application of a voltage or current thereto may correspond to programming or writing information, and sensing the resistance value of a resistance layer may correspond to reading information. For convenience, the information storage device 140 is described as MRAM in the following description, and the structure and operation of the MRAM is described below in detail with reference to FIGS. 2A to 5B.

The information storage device 140 may include a lower electrode 142, a resistance layer 144, an upper electrode 146, and a spacer 148. The resistance layer 144 may be, for example, an MTJ device and may be arranged between the lower electrode 142 and the upper electrode 146. In the following description, the MTJ device is referenced by 144 that is the same reference numeral as the resistance layer 144. The lower electrode 142 and the upper electrode 146 may each include a conductive material having a relatively low reactivity. In some embodiments, the lower electrode 142 and the upper electrode 146 may each include a metal or conductive metal nitride. For example, the lower electrode 142 and the upper electrode 146 may each have a single layer structure including at least one material selected from among Ti, Ta, W, Ru, TiN, and TaN, or a multilayer structure including a plurality of materials.

The MTJ device 144 may include a first magnetic layer (see M1 of FIG. 3), a tunnel barrier layer (see TB of FIG. 3), and a second magnetic layer (see M2 of FIG. 3) that are sequentially stacked on each other. The MTJ device 144 is described below in detail with reference to FIGS. 3 to 4B.

The spacer 148 may cover sidewalls of the lower electrode 142, the MTJ device 144, and the upper electrode 146. Furthermore, the spacer 148 may be disposed on a second upper insulating layer 164 between the information storage devices 140. According to an embodiment, the spacer 148 may be formed only on a sidewall of at least part of the information storage device 140.

The bit line 150 may be disposed above the information storing layer 140L. The bit line 150 may be connected to an end of the information storage device 140, for example, the upper electrode 146. In FIG. 1, while the bit line 150 is disposed only in the cell area CA, according to some embodiments, the bit line 150 may at least partially extend to the core/periphery area CPA.

An upper insulating layer 160 may be disposed on the multi-wire layer 110. The upper insulating layer 160 may include a first upper insulating layer 162, the second upper insulating layer 164, a third upper insulating layer 166, and a mold insulating layer 168. The first upper insulating layer 162, which is a layer formed in a planarization process like a CMP process, may include, for example, SiCN. Although not illustrated, the first upper insulating layer 162 may be formed in the interlayer insulating layer 112.

The second upper insulating layer 164 and the third upper insulating layer 166 may be formed only in the cell area CA. There may be unevenness in an upper surface of the second upper insulating layer 164, which may be caused in the information storage device 140 patterning process by ion beam etch (IBE). The third upper insulating layer 166 may fill between the information storage devices 140. In FIG. 1, although not illustrated, the lower electrode 142 of the information storage device 140 may be connected to the metal wire 114 of the first multi-wire layer 110C of the cell area CA by penetrating the first upper insulating layer 162 and the second upper insulating layer 164.

The mold insulating layer 168 may be disposed on the core/periphery area CPA. After patterning the information storage device 140, the third upper insulating layer 166 may be formed to cover the information storage device 140. Thereafter, the second upper insulating layer 164 and the third upper insulating layer 166 in the core/periphery area CPA may be removed, and then the mold insulating layer 168 may be formed. As such, a process of forming the mold insulating layer 168 is referred to as the mold replace process. The mold insulating layer 168 may include, for example, a low-k material and reduce parasitic capacitance in the core/periphery area CPA.

When a metal wire is arranged directly under the first upper insulating layer 162 of the core/periphery area CPA, in the mold replace process, the metal wire may be damaged. However, in the memory device 100 according to an embodiment, as described above, a fourth metal wire may not be arranged in the core/periphery area CPA. In other words, a metal wire may not be arranged directly under the first upper insulating layer 162. Accordingly, in the mold replace process, damage to the metal wire, for example, the fourth metal wire, directly under the first upper insulating layer 162 may be prevented.

In the memory device 100 according to an embodiment, only the first to third metal wires M1 to M3 may be arranged in the core/periphery area CPA, and the fourth metal wire ML4 may not be arranged therein. Accordingly, in the core/periphery area CPA, the third metal wire ML3 may be used as a wire for a reference line. As such, as the third metal wire ML3 is used as a wire for a reference line in the core/periphery area CPA, the damage to the fourth metal wire ML4, and a sensing error according thereto, which occurs as the fourth metal wire ML4 is used as a wire for a reference line in the core/periphery area CPA according to the related art, may be prevented. As a result, according to the memory device 100 according to an embodiment, the reliability and yield of a memory device may be improved.

Figure 2A:
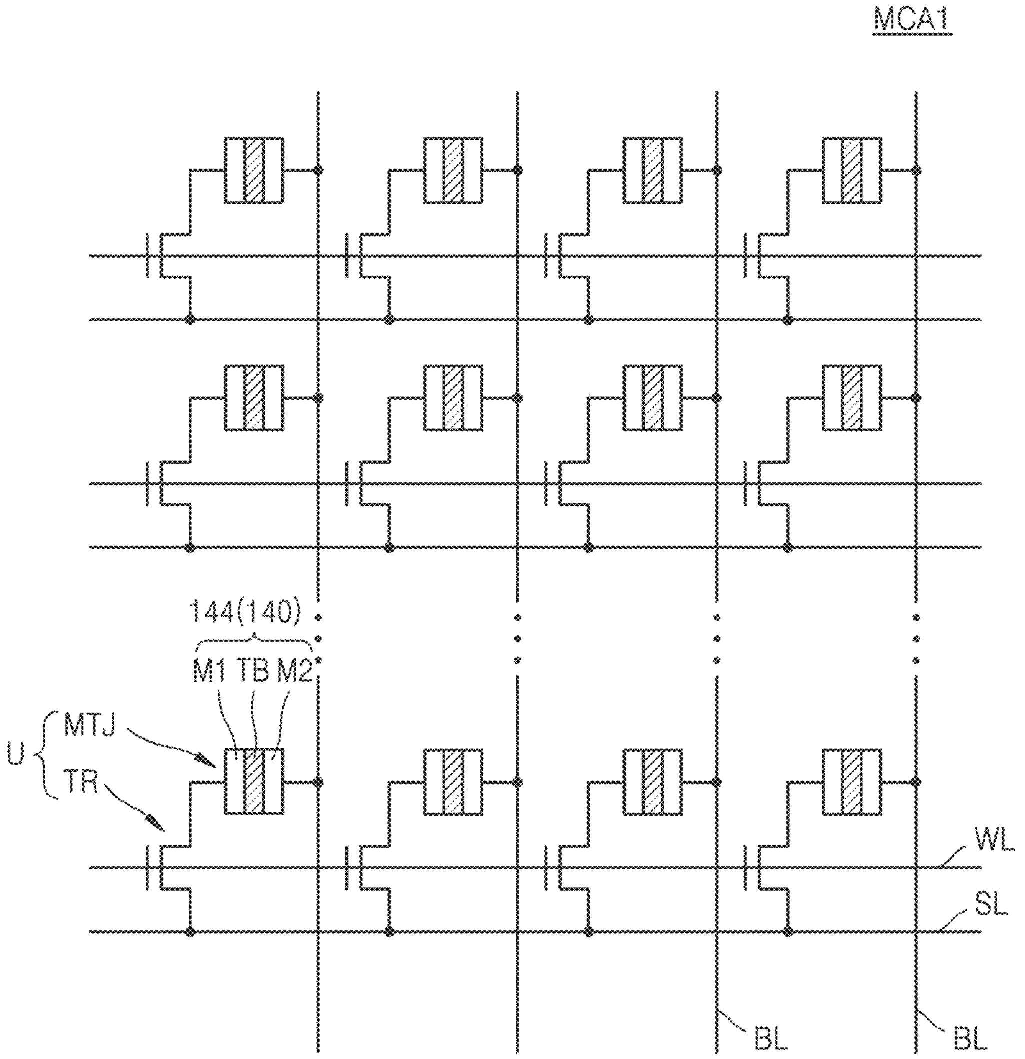
FIGS. 2A and 2B are circuit diagrams of a cell array of a magnetic random access memory (MRAM) device that is the nonvolatile memory device of FIG. 1.
Figure 2B:
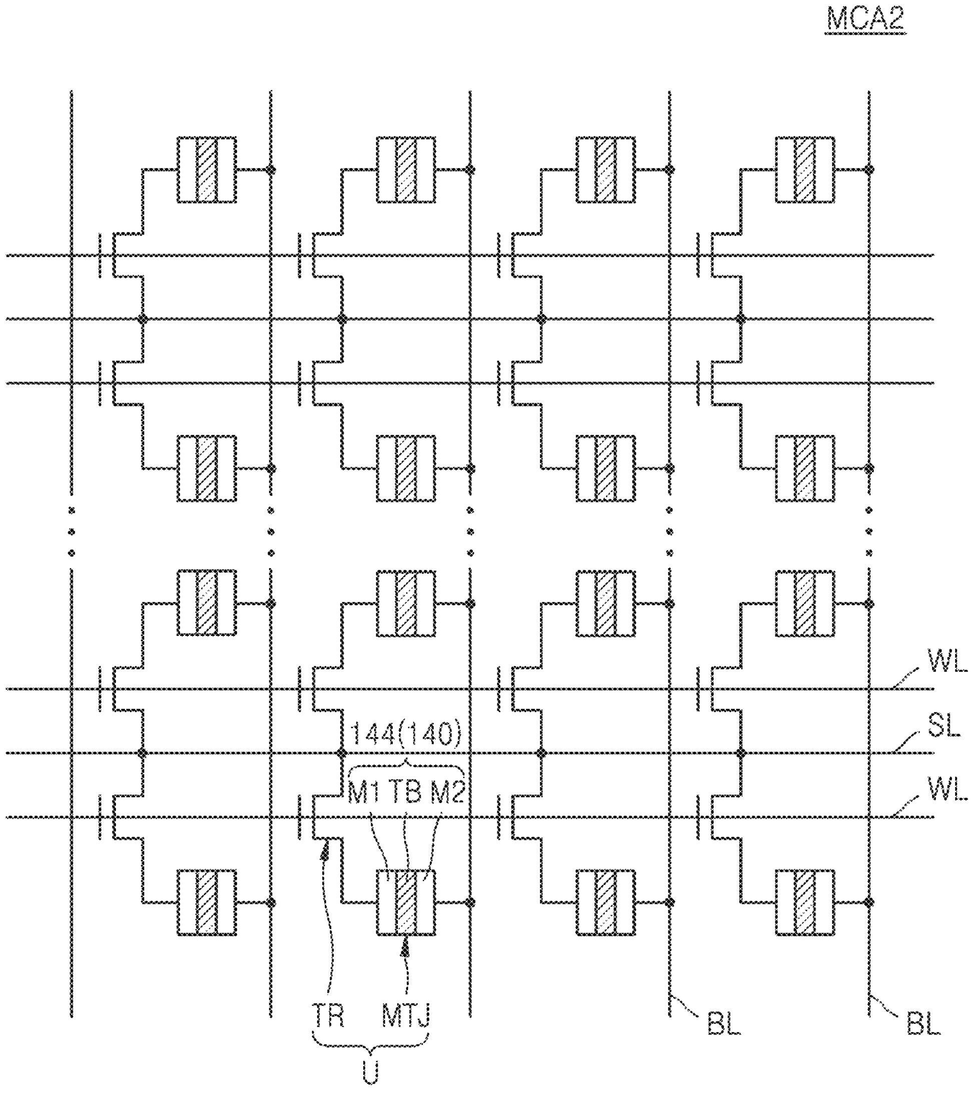

FIGS. 2A and 2B are circuit diagrams of a cell array of an MRAM device that is the memory device 100 of FIG. 1. The memory device 100 according to an embodiment is described with reference to FIG. 1 and FIGS. 2A and 2B together, and the contents already described with reference to FIG. 1 are briefly described or omitted.

Referring to FIG. 2A, the memory device 100 according to an embodiment may include an MRAM cell array MCA1. The MRAM cell array MCA1 may include a plurality of word lines WL, a plurality of bit lines BL (150), a plurality of source lines SL (130), and a plurality of unit memory cells U arranged in an area where the word lines WL intersect the bit lines BL. The unit memory cell U may include the MTJ device MTJ (144) and the cell transistor TR. One unit memory cell U may be selected by one bit line BL and one source line SL. Accordingly, the MRAM cell array MCA1 of the memory device 100 according to an embodiment may have a 1MTJ-1TR structure. The MTJ device 144 may include a first magnetic layer M1, a tunnel barrier layer TB, and a second magnetic layer M2. The first magnetic layer M1 may be a pinned layer, and the second magnetic layer M2 may be a free layer.

In the unit memory cell U, the first magnetic layer M1 of the MTJ device 144 may be connected to the drain region D of the cell transistor TR, and the second magnetic layer M2 of the MTJ device 144 may be connected to the bit line BL. Furthermore, the source region S of the cell transistor TR may be connected to the source line SL, and a gate of the cell transistor TR may be connected to the word line WL. As described above, the MTJ device 144 may be replaced with a resistance layer, such as PRAM, FRAM, ReRAM, or the like. Materials for forming a resistance layer, such as MRAM, PRAM, FRAM, ReRAM, or the like, may have a resistance value that varies depending on the amplitude and/or direction of a current or voltage, and may have nonvolatile characteristics of maintaining a resistance value thereof, without change, even when the current or voltage is cut off.

For reference, when the general characteristics of the MRAM are described, it may be stated that the MRAM is a nonvolatile memory device based on magneto-resistance. The MRAM may be different from volatile RAM in terms of many aspects. For example, as the MRAM is nonvolatile, even when memory device power is turned off, the MRAM may retain memory data. Generally, although nonvolatile RAM is slower than volatile RAM, MRAM may have read and write response times comparable with the read and write response times of volatile RAM. For example, the MRAM may be a universal memory device having the low cost, high capacity characteristics of DRAM, the high speed operation characteristics of SRAM, and the nonvolatile characteristics of flash memory.

The MRAM may store data by magneto-resistance elements, unlike a typical RAM technology for storing data by electric charge. Generally, the magneto-resistance elements of the MRAM may include two magnetic layers, and each magnetic layer may be magnetized in one of two directions. For example, the MRAM may be a nonvolatile memory device for reading and writing data using a MTJ device including two magnetic layers and an insulating film between the two magnetic layers. The resistance value of the MTJ device may vary depending on the magnetization direction of the magnetic layer, and by using a difference in the resistance value data may be programmed, that is, stored, or data may be deleted.

The MRAM may change the magnetization direction of the magnetic layer by using a spin transfer torque (STT) phenomenon. The STT phenomenon may mean that when a current in which spin is polarized in one direction flows, the magnetization direction of the magnetic layer is changed by the spin transfer of the electron. Accordingly, the MRAM using the STT phenomenon may be referred to as STT-RAM or STT-MRAM. Typical STT-MRAM may include the MTJ device 144. The MTJ device 144 may include, as described above, the first magnetic layer M1, the tunnel barrier layer TB, and the second magnetic layer M2.

In the MTJ device 144, the first magnetic layer M1, as a pinned layer, may have a fixed magnetization direction. In contrast, the second magnetic layer M2, as a free layer, may have a magnetization direction changed by an applied program current. The program current may arrange the magnetization directions of the two magnetic layers M1 and M2 to be parallel or anti-parallel to each other, through the change in the magnetization direction of the second magnetic layer M2. When the magnetization directions are parallel to each other, it is a low ("0") state meaning that the resistance between the two magnetic layers M1 and M2 is low, and when the magnetization directions are anti-parallel to each other, it is a ("1") state meaning that the resistance between the two magnetic layers M1 and M2 is high. The switching of the magnetization direction of the second magnetic layer M2 and a high resistance or low resistance state between the magnetic layers according thereto may provide write and read operations of the MRAM.

For reference, for the MRAM in a toggle method in which the magnetization direction of a free layer is switched by a magnetic field generated by a program current, scaling may be limited due to write disturbance. The write disturbance may mean a phenomenon in which, when a plurality of cells are arranged in an MRAM cell array, the program current of the MRAM is relatively large, and thus, the program current applied to one memory cell causes a change in the field of a free layer of an adjacent cell. The write disturbance may be prevented using the STT phenomenon to a degree.

For the STT-MRAM, the program current may typically flow through the MTJ device 144. The first magnetic layer M1 may polarize the electron spin of a program current, and as the electron current that is spin-polarized passes through the MTJ device 144, torque may be generated. The spin-polarized electron current applies torque to the second magnetic layer M2 so as to interact with the second magnetic layer M2. When the torque of the spin-polarized electron current passing through the MTJ device 144 is greater than a threshold switching current density, the torque applied by the spin-polarized electron current may be sufficient to switch the magnetization direction of the second magnetic layer M2. Accordingly, the magnetization direction of the second magnetic layer M2 may be parallel or anti-parallel to each other with respect to the first magnetic layer M1, so that the resistance state of the MTJ device 144 may be changed.

As such, as STT-MRAM switches the magnetization direction of the second magnetic layer M2 through the spin-polarized electron current, there is no need to generate a magnetic field by applying a large current to switch the magnetization direction of the second magnetic layer M2. Accordingly, STT-MRAM may contribute to the reduction of the program current with the reduction of a cell size, and may also prevent the write disturbance. In addition, STT-MRAM has a high tunnel magnetoresistance ratio, and as a ratio between a high resistance state and a low resistance states is high, a read operation in a magnetic domain may be improved.

The word line WL may be enabled by a row decoder, and may be connected to a word line driver for driving a word line selection voltage. The word line selection voltage may activate the word line WL for the MTJ device 144 to perform a logic state read or write operation.

The source line SL may be connected to a source line circuit. The source line circuit may receive an address signal and a read/write signal, decode the received signals, and apply a source line selection signal to the source line SL that is selected. A ground reference voltage may be applied to the source lines SL that are not selected.

The bit line BL may be connected to a column selection circuit driven by a column selection signal. The column selection signal may be selected by a column decoder. For example, the selected column selection signal may turn on a column selection transistor in the column selection circuit, and select the bit line BL. The logic state of the MTJ device 144 may be output through a sense amplifier 176 (see FIG. 3) through the bit line BL selected through the read operation. Furthermore, as a write current is transmitted through the bit line BL selected through the write operation, a logic state may be stored in the MTJ device 144.

Referring to FIG. 2B, an MRAM cell array MCA2 of the memory device 100 according to an embodiment may be different from the MRAM cell array MCA1 of FIG. 2A in terms of a connection structure of the source line SL. For example, while the MRAM cell array MCA1 of FIG. 2A has the 1MTJ-1TR structure in which one cell transistor TR and the MTJ device 144 are selected according to the selection of one bit line BL and one source line SL, the MRAM cell array MCA2 according to the present embodiment may have a 2MTJ-2TR structure in which two cell transistors TR and the MTJ devices 144 are selected according to the selection of one bit line BL and one source line SL. Accordingly, in the MRAM cell array MCA2 according to the present embodiment, the source line SL may be commonly connected to source regions of two cell transistors TR.

Generally, the MRAM cell array MCA1 of FIG. 2A is referred to as a separate source line structure and the MRAM cell array MCA2 of FIG. 2B is referred to as a common source line structure.

For reference, for the MRAM, in order to store the logic states of "0" and "1" in the MTJ device 144 that is a memory device, a current flowing in the MTJ device 144 is bidirectional. In other words, the currents flowing in the MTJ device 144 to write data "0" and data "1" are in the opposite directions. For the structure in which a current flows in the opposite direction, in the MRAM, the source line SL exists in addition to the bit line BL to change potential differences of the MTJ device 144 and the cell transistor TR therebetween, thereby enabling selection of the direction of a current flowing in the MTJ device 144.

The MRAM may be divided into the separate source line structure and the common source line structure according to the connection of the source line SL and an operation method thereof. For the common source line structure, as the source line SL is shared by cell transistors on both sides, it may be advantageous in terms of area, but as a reference voltage is applied to the source line SL, an operating voltage may be increased. In contrast, for the separate source line structure, as the voltages of the bit line BL and the source line SL may be used interchangeably, the operating voltage may be reduced, but as the source lines SL corresponding to the bit lines BL are all arranged, it may be disadvantageous in terms of area, that is, density.

Figure 3:
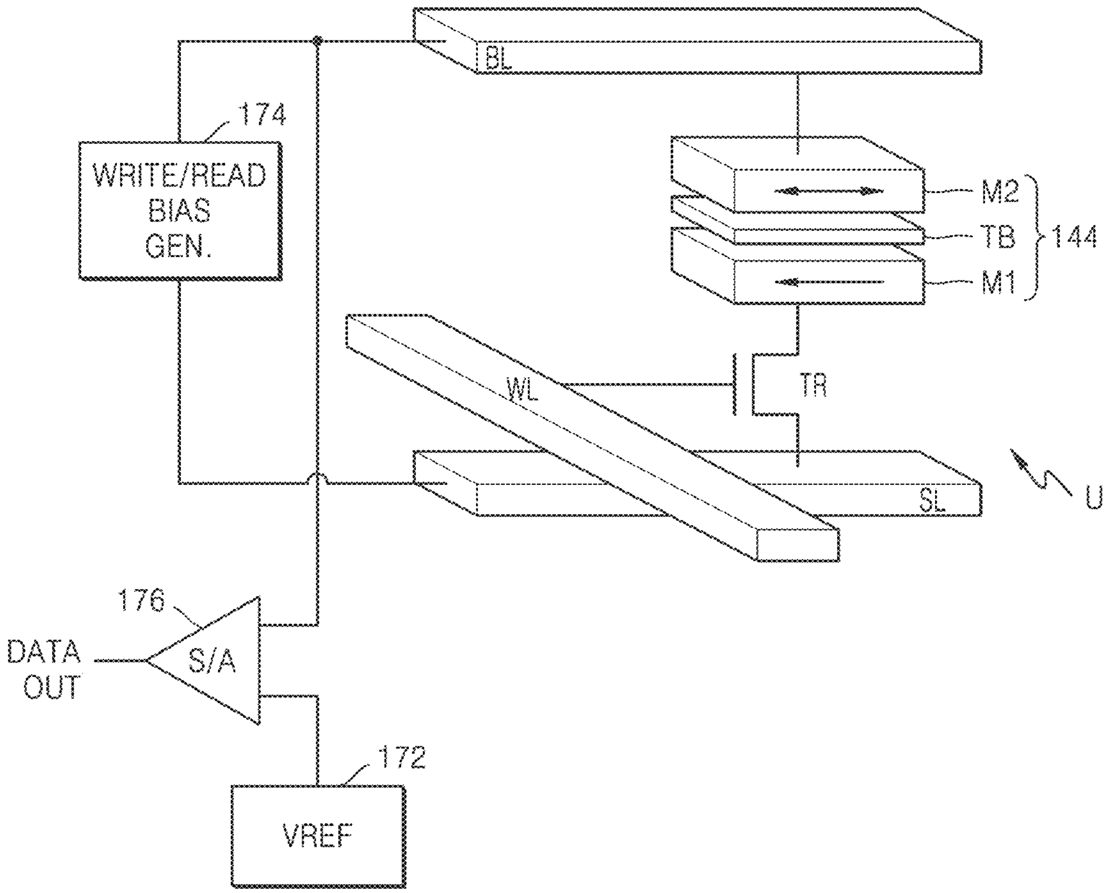
FIG. 3 is a diagram three-dimensionally showing a unit memory cell in the cell array of the MRAM device of FIG. 2A.

FIG. 3 is a diagram three-dimensionally showing a unit memory cell in the cell array of the MRAM device of FIG. 2A. The memory device 100 according to an embodiment is described with reference to FIGS. 1 and 2A and FIG. 3 together, and the contents already described with reference to FIG. are briefly described or omitted.

Referring to FIG. 3, the unit memory cell U of the MRAM cell array MCA1 may include the MTJ device 144 and the cell transistor TR. The gate of the cell transistor TR may be connected to the word line WL, and the drain region D of the cell transistor TR may be connected to the bit line BL via the MTJ device 144. Furthermore, the source region S of the cell transistor TR may be connected to the source line SL.

The MTJ device 144 may include the first magnetic layer M1 and the second magnetic layer M2, and the tunnel barrier layer TB therebetween. The magnetization direction of the first magnetic layer M1 may be fixed, and the magnetization direction of the second magnetic layer M2 may be in a parallel or anti-parallel direction with the magnetization direction of the first magnetic layer M1 according to the stored data, by the write operation. To fix the magnetization direction of the first magnetic layer M1, for example, an anti-ferromagnetic layer may be further provided.

To perform a write operation on an MRAM cell, a logic high voltage is applied to the word line WL that is selected so that the cell transistor TR may be turned on. A program current, that is, the write current, provided by a write/read bias generator 174 may be applied to the bit line BL and the source line SL that are selected. The direction of the write current may be determined by the logic state to be stored in the MTJ device 144.

To perform a read operation on an MRAM cell, a logic high voltage is applied to the word line WL that is selected so that the cell transistor TR is turned on, and a read current may be applied to the bit line BL and the source line SL that are selected. Accordingly, a voltage is developed across the MTJ device 144 and sensed by a sense amplifier 176, and to determine the logic state stored in the MTJ device 144, the sensed voltages may be compared with a voltage of a reference voltage generator 172. According to a comparison result, the data stored in the MTJ device 144 may be determined.

Figure 4A:
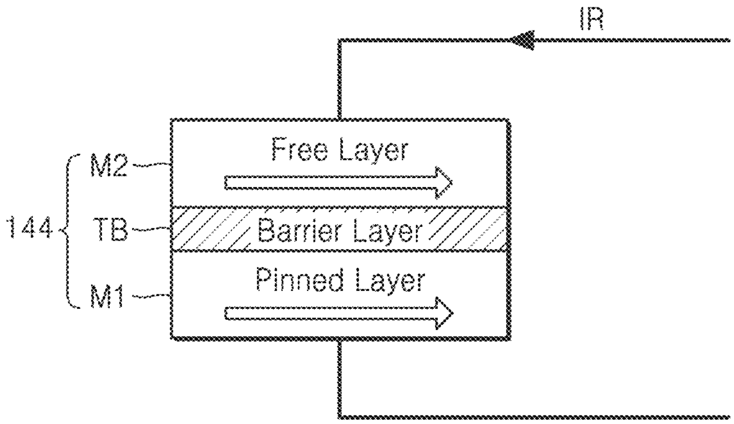
FIGS. 4A and 4B are conceptual views for explaining data stored according to a magnetization direction in the MTJ device of FIG. 3.
Figure 4B:
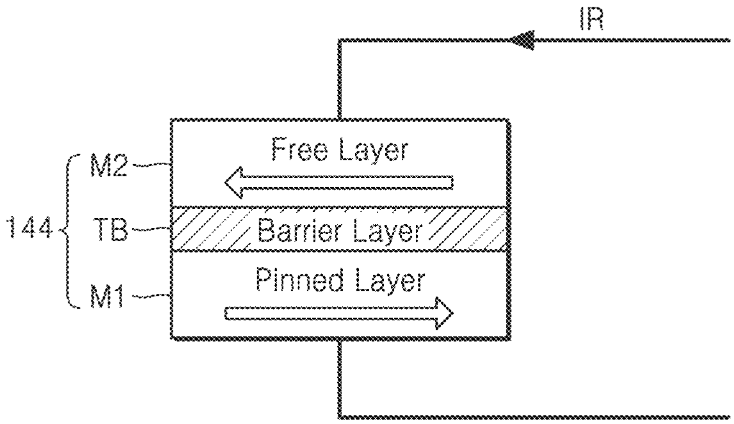

FIGS. 4A and 4B are conceptual views for explaining data stored according to a magnetization direction in the MTJ device 144 of FIG. 3.

Referring to FIGS. 4A and 4B, a resistance value of the MTJ device 144 may vary depending on the magnetization direction of the second magnetic layer M2. When a read current IR flows in the MTJ device 144, a data voltage according to the resistance value of the MTJ device 144 may be output. As the intensity of the read current IR is much smaller than the intensity of the write current, the magnetization direction of the second magnetic layer M2 is not changed by the read current IR.

As illustrated in FIG. 4A, in the MTJ device 144, the magnetization direction of the second magnetic layer M2 and the magnetization direction of the first magnetic layer M1 are parallel to each other. The MTJ device 144 in this state may have a low resistance value, and thus, data "O" may be output through the read operation.

As illustrated in FIG. 4B, in the MTJ device 144, the magnetization direction of the second magnetic layer M2 is anti-parallel to the magnetization direction of the first magnetic layer M1. The MTJ device 144 in this state may have a high resistance value. Accordingly, data "1" may be output through the read operation.

In the MRAM cell array MCA1 according to the present embodiment, the second magnetic layer M2 and the first magnetic layer M1 of the MTJ device 144 may have a vertical magnetic device structure. In the MTJ device 144 of FIGS. 4A and 4B, for convenience of understanding, the second magnetic layer M2 and the first magnetic layer M1 are illustrated as having a horizontal magnetic device structure. In some embodiments, the second magnetic layer M2 and the first magnetic layer M1 of the MTJ device 144 may have a horizontal magnetic device structure.

Figure 5A:
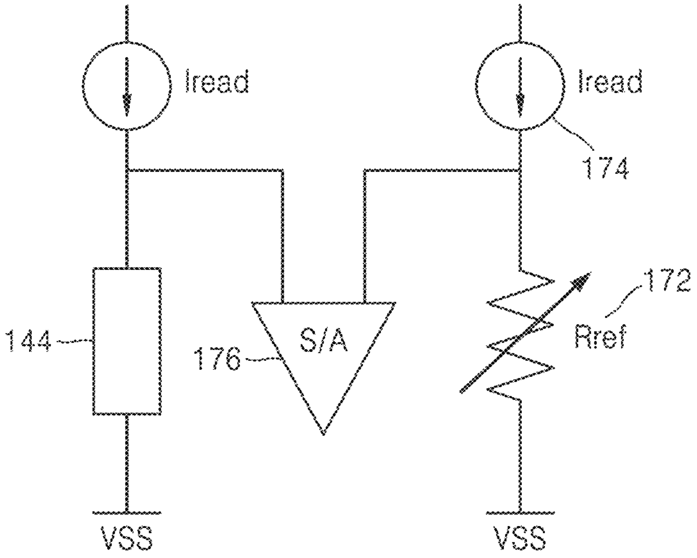
FIGS. 5A and 5B are respectively a circuit diagram and a resistance graph for explaining the principle of sensing resistance in the nonvolatile memory device of FIG. 1.
Figure 5B:
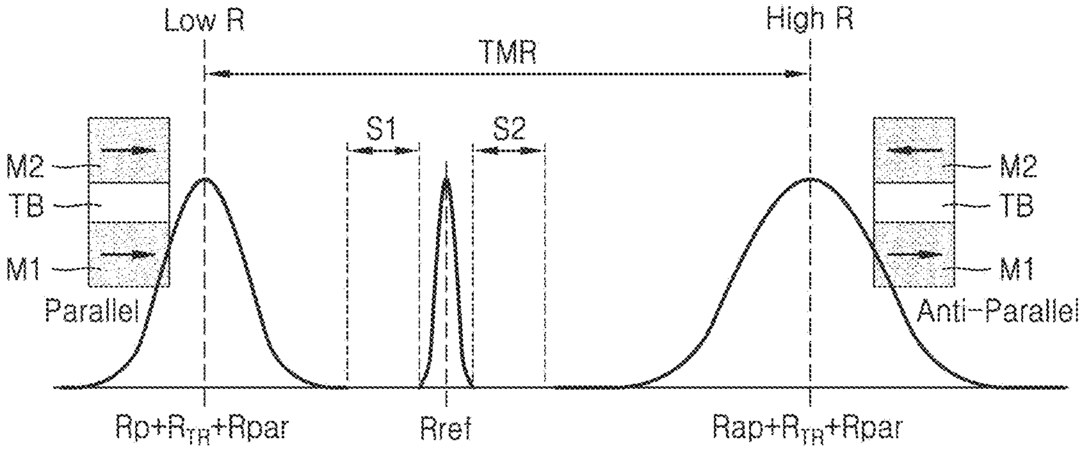

FIGS. 5A and 5B are respectively a circuit diagram and a resistance graph for explaining the principle of sensing resistance in the memory device 100 of FIG. 1. In FIG. 5B, an x-axis denotes a resistance value, and the unit is an arbitrary unit. A y-axis denotes the number of cells having a certain resistance value, and as illustrated, may have the form of a normal distribution.

Referring to FIGS. 5A and 5B, as described above, to read the data in the MTJ device 144, in other words, to sense the logic state of the MTJ device 144, a read current Iread may be applied to the MTJ device 144. Accordingly, as a voltage is developed across the MTJ device 144, the voltage may be sensed by the sense amplifier 176. Furthermore, as the read current Iread is applied to the reference voltage generator 172, a reference voltage is developed and may be sensed by the sense amplifier 176. In order to determine the logic state stored in the MTJ device 144, the sense amplifier 176 may compare the voltage of the MTJ device 144 with the voltage of the reference voltage generator 172. According to a comparison result, the logic state of the MTJ device 144, that is, the data stored in the MTJ device 144, may be determined.

As described above, when the magnetization direction of the second magnetic layer M2 and the magnetization direction of the first magnetic layer M1 are arranged parallel to each other, a low resistance value Low R may be obtained. In contrast, when the magnetization direction of the second magnetic layer M2 and the magnetization direction of the first magnetic layer M1 are arranged anti-parallel to each other, a high resistance value High R may be obtained.

For reference, the sense amplifier 176 may sense, as a sensing voltage, a voltage not only by the resistance of the MTJ device 144 but also by a resistance of the cell transistor TR and a parasitic resistance. Accordingly, in the graph of FIG. 5B, Rp may denote the resistance of a parallel state of the MTJ device 144, Rap may denote the resistance of a parallel state of the MTJ device 144, RTR may denote the resistance of the cell transistor TR, and Rpar may denote a parasitic resistance.

Tunnel magneto-resistance (TMR) may be defined to be (Rap−Rp)/Rp, and as TMR increases, an interval between the low resistance value Low R and the high resistance value High R may increase. Furthermore, when TMR is great, a reference resistance value Rref may be arranged with sufficient intervals S1 and S2 with respect to each of the low resistance value Low R and the high resistance value High R. Accordingly, the resistance state of the MTJ device 144, and the logic state of the MTJ device 144 according thereto, may be clearly sensed.

When TMR is small or the reference resistance value Rref is located off to one side, the resistance state of the MTJ device 144, and the logic state of the MTJ device 144 according thereto, may not be accurately sensed, or may be sensed incorrectly. For example, when a wire for a reference line is damaged so that resistance increases, the reference resistance value Rref may increase. In this case, accuracy in the sensing of the logic state of the MTJ device 144 may decrease. Furthermore, when the reference resistance value Rref exceeds the high resistance value High R, the resistance state of the MTJ device 144 in all cells is determined to be the low resistance value Low R, and thus, the logic state of the MTJ device 144 may not be sensed at all. As a result, the reliability of the information storage device 140 including the MTJ device 144 is deteriorated, and the overall yield of the memory device 100 is reduced.

Figure 6A:
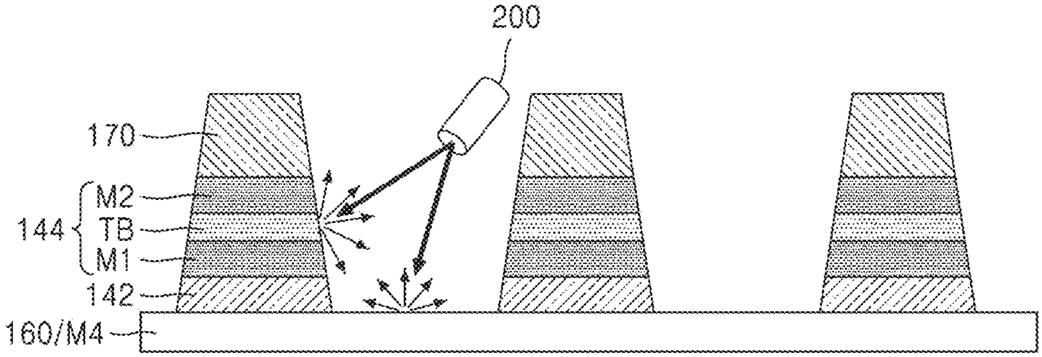
FIGS. 6A and 6B are conceptual views showing a process of forming an information storing layer in the nonvolatile memory device of FIG. 1.
Figure 6B:
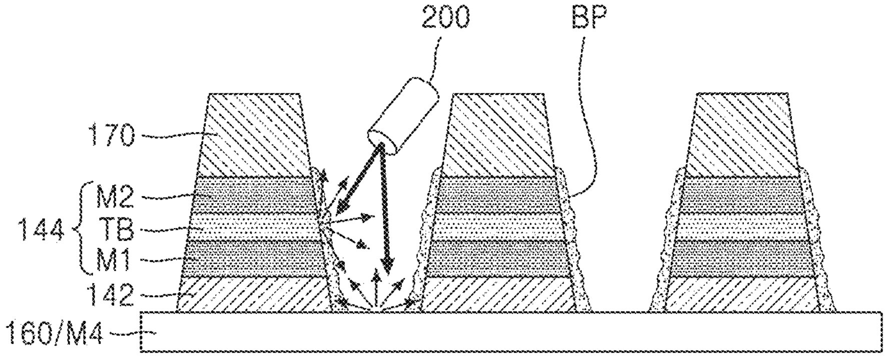
Figure 7:
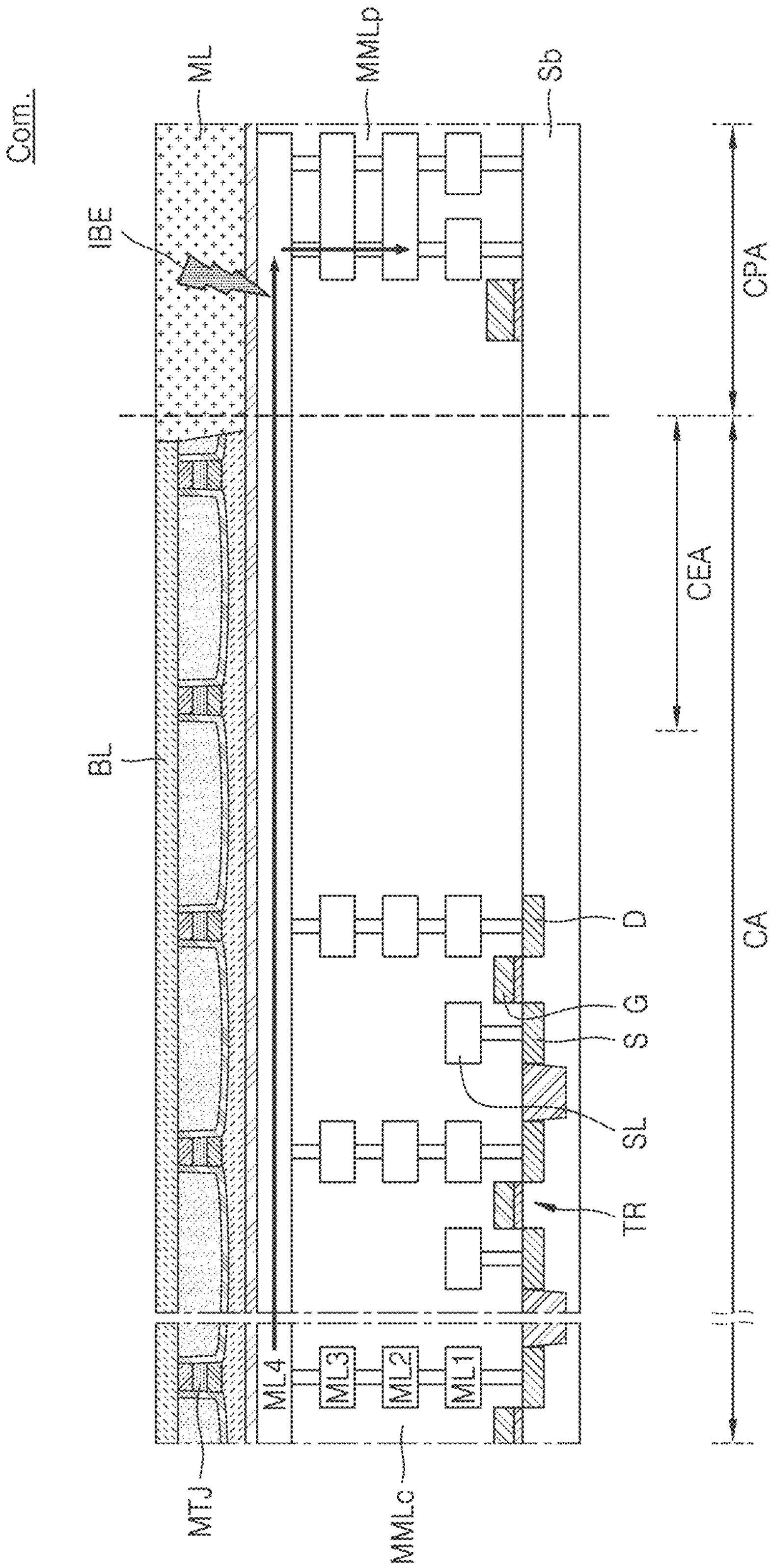
FIG. 7 is a cross-sectional view of a nonvolatile memory device according to a comparative example.

FIGS. 6A and 6B are conceptual views showing a process of forming an information storing layer in the memory device 100 of FIG. 1, and FIG. 7 is a cross-sectional view of a nonvolatile memory device according to a comparative example (Com.).

Referring to FIGS. 6A to 7, in the memory device 100 according to an embodiment, the information storage device 140 including the MTJ device 144 may be formed through IBE. For example, in embodiments where the MTJ device 144 is formed of a noble metal or other material that is difficult to remove using typical plasma based chemistries, the information storage device 140 may be patterned through an IBE process that is a physical etching method, not a reactive ion etch (RIE) process according to the related art. Examples of noble metals include gold, and platinum. Examples of other materials that can be difficult to remove using typical plasma based chemistries include, but are not limited to, piezo electric materials such as PZT (lead zirconate titanate), LNO (lithium niobate), and AlScN (aluminum scandium nitride) $Al_2O_3$, Ni, Fc, Cr, Co, Cu, Mn and Pd.

Furthermore, the patterning of the information storage device 140 through the IBE process may be performed through a method of first forming, on the upper insulating layer 160, a material layer for a lower electrode, a material layer for an MTJ device, and a hard mask layer 170 and radiating an ion beam thereto using an ion gun 200 to etch the material layer for a lower electrode and the material layer for an MTJ device in the form of a hard mask layer pattern. Furthermore, after forming the lower electrode 142 and the MTJ device 144, to remove a metal by-product BP remaining on sidewalls of the lower electrode 142 and the MTJ device 144 and on the upper insulating layer 160, an additional IBE process of radiating the ion beam by a certain angle, not by a right angle, may be further performed.

As illustrated in FIG. 6A, when the MTJ devices 144 are formed at wide intervals, the movement of the ion gun 200 is free, and thus, a patterning process of the information storage device 140, and a removing process of the metal by-product BP remaining on the sidewalls of the lower electrode 142 and the MTJ device 144 and the upper insulating layer 160, may be smoothly performed. In contrast, as illustrated in FIG. 6B, when the MTJ devices 144 are formed at narrow intervals, the movement of the ion gun 200 is limited, and thus, the patterning process of the information storage device 140 and the removing process of the metal by-product BP may not be smoothly performed. In particular, the metal by-product BP may not be sufficiently removed through the IBE process. Accordingly, the IBE process may be excessively performed to sufficiently remove the metal by-product BP.

Generally, the MTJ devices 144 may be arranged at narrow intervals in the cell area CA. Accordingly, in the patterning process of the information storage device 140 and the removing process of the metal by-product BP in the cell area CA, as other adjacent MTJ devices 144 prevent etching, the metal wire 114, for example, the fourth metal wire ML4, below the upper insulating layer 160 may not be damaged much. However, in the edge portion of the cell area CA and the core/periphery area CPA, there is no etching prevention by the MTJ devices 144 in the patterning process of the information storage device 140 and the removing process of the metal by-product BP, and accordingly, the fourth metal wire ML4 may be damaged much. The damage to the fourth metal wire ML4 may mean that the fourth metal wire ML4 becomes thinner or is cut off because Cu forming the fourth metal wire ML4 melts in the IBE process.

As in a nonvolatile memory device according to the comparative example (Com.) of FIG. 7, when the fourth metal wire ML4 extends from the cell area CA to the core/periphery area CPA and is used as a wire for a reference line, in the edge portion of the cell area CA, the IBE process may be performed at the same level as that in the cell area CA, and accordingly, damage to the fourth metal wire ML4 may greatly occur. In the core/periphery area CPA, as the MTJ devices 144 are not arranged, the damage to the fourth metal wire ML4 may not be great in the patterning process of the information storage device 140 and the removing process of the metal by-product BP, except for the portion adjacent to the cell area CA. Instead, as described above, the mold replace process may be performed in the core/periphery area CPA, and in the mold replace process, the fourth metal wire ML4 of the core/periphery area CPA may be damaged. In FIG. 7, MMLc and MMLp denote multi-wire layers in the cell area CA and the core/periphery area CPA, and ML denotes a mold insulating layer. Furthermore, Sb denotes a substrate, and G denotes the gate of the cell transistor TR.

As a result, when the fourth metal wire ML4 is arranged in a structure of extending from the cell area CA to the core/periphery area CPA, damage to the fourth metal wire ML4 may occur in the patterning process of the information storage device 140 and the removing process of the metal by-product BP, and the mold replace process. Accordingly, when the fourth metal wire ML4 configured as above is used as a wire for a reference line, the resistance of the fourth metal wire ML4 may be increased due to the damage to the fourth metal wire ML4, and the reference resistance value Rref may be increased. As a result, a defect that resistance states of all cells in a section using the fourth metal wire ML4 are sensed to be a low resistance value may be caused. In contrast, for the memory device 100 according to an embodiment, as the third metal wire ML3 is used as a wire for a reference line in the cell edge area CEA and the core/periphery area CPA, the issues described above may be addressed.

Figure 8:
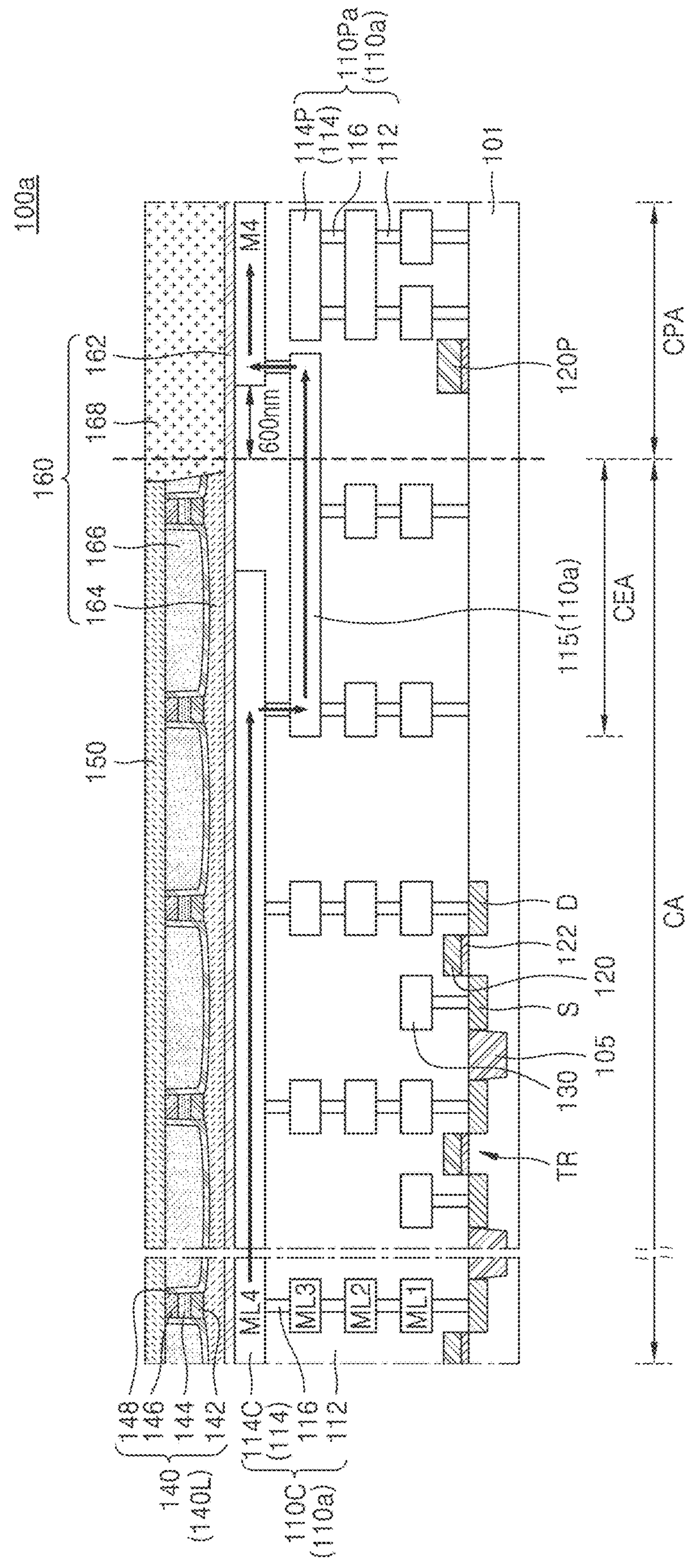
FIG. 8 is a cross-sectional view of a nonvolatile memory device according to an embodiment.

FIG. 8 is a cross-sectional view of a nonvolatile memory device according to an embodiment. The contents already described with reference to FIGS. 1 to 7 are briefly described or omitted.

Referring to FIG. 8, a nonvolatile memory device 100*a* (hereinafter, briefly referred to as the memory device) according to the present embodiment may be different from the memory device 100 of FIG. 1 in terms of the structure of a multi-wire layer 110*a*. In detail, the memory device 100*a* according to the present embodiment may include the substrate 101, the cell transistor TR, the multi-wire layer 110*a*, the source line 130, the information storing layer 140L, and the bit line 150. The substrate 101, the cell transistor TR, the source line 130, the information storing layer 140L, and the bit line 150 are the same as those described above in the description of the memory device 100 of FIG. 1.

In the memory device 100*a* according to the present embodiment, a second multi-wire layer 110Pa of the core/periphery area CPA may include the fourth metal wire ML4. Furthermore, the multi-wire layer 110*a* may include an additional connection metal wire 115. For the memory device 100*a* according to the present embodiment, in the layout configuration of the multi-wire layer 110*a*, as an extra space for the third metal wire ML3 is insufficient in the core/periphery area CPA adjacent to the cell area CA, the fourth metal wire ML4 may be required. In the structure of the multi-wire layer 110*a*, a connection metal wire 115 is separately arranged in the cell edge area CEA, and the fourth metal wire ML4 of the cell area CA and the fourth metal wire ML4 of the core/periphery area CPA may be connected to each other through the connection metal wire 115.

In detail, the connection metal wire 115 may be at the same level as that of the third metal wire ML3 in a vertical direction. The connection metal wire 115 may be connected to the fourth metal wire ML4 of the cell area CA in the cell edge area CEA through the vertical via 116. The connection metal wire 115 may extend toward the core/periphery area CPA in the cell edge area CEA. Furthermore, the connection metal wire 115 may be connected to the fourth metal wire ML4 of the core/periphery area CPA in the edge portion of the core/periphery area CPA adjacent to the cell area CA.

As indicated by arrows in FIG. 8, the fourth metal wire ML4 of the cell area CA, the connection metal wire 115, and the fourth metal wire ML4 of the core/periphery area CPA may be used as a wire for a reference line. In the memory device 100*a* according to the present embodiment, as the connection metal wire 115 is arranged in the cell edge area CEA, the damage to the fourth metal wire ML4 in the cell edge area CEA may not occur in the patterning process of the information storage device 140 and the removing process of the metal by-product BP. Furthermore, the fourth metal wire ML4 of the core/periphery area CPA may be apart by a certain minimum distance, for example a distance of 600 nm or more from the cell edge area CEA area, in detail, the information storage device 140 located at the outermost side, to avoid damage in the patterning process of the information storage device 140 and the removing process of the metal by-product BP.

Generally, in the patterning process of the information storage device 140 and the removing process of the metal by-product BP, and the mold replace process, the damage to the fourth metal wire ML4 in the cell edge area CEA and the core/periphery area CPA adjacent to the cell edge area CEA may be quite severe. However, in the memory device 100*a* according to the present embodiment, as the connection metal wire 115 is additionally arranged in the cell edge area CEA and the edge portion of the core/periphery area CPA, the damage to the fourth metal wire ML4, and the increase of the reference resistance value Rref according thereto may be prevented. As a result, the memory device 100*a* according to the present embodiment may improve the reliability of a memory device by preventing a sensing error and the yield of the memory device may be improved.

While various embodiments have been particularly shown and described with reference to embodiments thereof, it will be understood that various changes in form and details may be made therein without departing from the spirit and scope of the following claims.

What is claimed is:

1. A nonvolatile memory device comprising:

a substrate defining a cell area and a periphery area;

a multi-wire layer on the cell area and the periphery area and including a plurality of metal wires of a multilayer; and an information storing layer including information storage devices on the multi-wire layer of the cell area in a two-dimensional array structure, wherein the plurality of metal wires includes a first metal wire and a second metal wire, the first metal wire is in an uppermost portion of the multi-wire layer of the periphery area and is at a level lower than the second metal wire, and the second metal wire is in an uppermost portion of the multi-wire layer of the cell area.

2. The nonvolatile memory device of claim 1, wherein the first metal wire and the second metal wire are configured as a reference line for sensing a logic state of an information storage device of the information storage devices, and the first metal wire is at a same level as a third metal wire that is directly below the second metal wire.

3. The nonvolatile memory device of claim 2, wherein the third metal wire extends from the cell area to the periphery area and is connected to the first metal wire.

4. The nonvolatile memory device of claim 1, wherein the information storage devices include magnetic random access memory (MRAM), phase-change RAM (PRAM), ferroelectric RAM (FRAM), or resistive RAM (ReRAM).

5. The nonvolatile memory device of claim 1, wherein the information storage devices include magnetic random access memory (MRAM), the MRAM includes a cell transistor and a magnetic tunnel junction (MTJ) device, and the MRAM includes a dummy MTJ device in an edge portion of the cell area adjacent to the periphery area.

6. The nonvolatile memory device of claim 5, wherein the MTJ device includes a lower electrode, a resistance layer, and an upper electrode, and the resistance layer includes a first magnetic layer, a tunnel barrier layer, and a second magnetic layer.

7. The nonvolatile memory device of claim 5, wherein a third metal wire is directly below the second metal wire and is connected to the second metal wire in the edge portion through a vertical via, extends to the periphery area, and is connected to the first metal wire.

8. The nonvolatile memory device of claim 5, wherein the cell transistor is below the multi-wire layer, and a word line is connected to a gate of the cell transistor, a bit line is connected to a first end of the MTJ device, a drain region of the cell transistor is connected to a second end of the MTJ device, and a source line is connected to a source region of the cell transistor.

9. The nonvolatile memory device of claim 1, wherein an upper insulating layer including a first insulating layer and a second insulating layer are above the first metal wire, an upper surface of the second metal wire is coplanar with an upper surface of a first interlayer insulating layer and is covered by the upper insulating layer, and the information storage devices are covered by a third insulating layer above the second insulating layer.

10. The nonvolatile memory device of claim 9, wherein dummy MTJ devices are in an edge portion of the cell area adjacent to the periphery area, and the first insulating layer is in the edge portion, and at least one dummy MTJ device of the dummy MTJ devices is on the first insulating layer.

11. A nonvolatile memory device comprising:

a substrate defining a cell area and a periphery area;

a multi-wire layer on the cell area and the periphery area and including metal wires of a multilayer; and an information storing layer including information storage devices on the multi-wire layer of the cell area in a two-dimensional array structure, wherein a first metal wire in an uppermost portion of the multi-wire layer of the periphery area is coplanar with a second metal wire in an uppermost portion of the multi-wire layer of the cell area, and the first metal wire and the second metal wire are connected to each other by a connection metal wire that is at a level lower than the first metal wire.

12. The nonvolatile memory device of claim 11, wherein the first metal wire, the second metal wire, and the connection metal wire are configured as a reference line for sensing a logic state of the information storage devices, and the connection metal wire is at a same level as a third metal wire that is directly below the first metal wire or the second metal wire.

13. The nonvolatile memory device of claim 11, wherein the information storage devices include magnetic random access memory (MRAM), the MRAM includes a cell transistor and a magnetic tunnel junction (MTJ) device, the MRAM includes a dummy MTJ device in an edge portion of the cell area adjacent to the periphery area, the second metal wire is connected to the connection metal wire in the edge portion through a first vertical via, and the first metal wire is connected to the connection metal wire in a portion adjacent to the edge portion through a second vertical via.

14. The nonvolatile memory device of claim 11, wherein the first metal wire is horizontally spaced apart from the information storage devices by a distance of 600 nm or more.

15. A nonvolatile memory device comprising:

a substrate defining a cell area and a periphery area;

a multi-wire layer on the cell area and the periphery area and including metal wires of a multilayer; and an information storing layer including information storage devices on the multi-wire layer of the cell area in a two-dimensional array structure, wherein a first metal wire in an uppermost portion of the multi-wire layer of the periphery area is at a same level as or a level lower than a second metal wire in an uppermost portion of the multi-wire layer of the cell area, and the first metal wire and the second metal wire are connected to each other by a separate connection metal wire, or through a third metal wire directly below the second metal wire.

16. The nonvolatile memory device of claim 15, wherein the first metal wire and the second metal wire are connected to each other by the separate connection metal wire, and the separate connection metal wire is at a same level as the third metal wire.

17. The nonvolatile memory device of claim 16, wherein the first metal wire, the second metal wire, and the separate connection metal wire are configured as a reference line for sensing a logic state of the information storage devices, and the first metal wire is horizontally spaced apart from the information storage devices.

18. The nonvolatile memory device of claim 15, wherein the first metal wire and the second metal wire are connected to each other through the third metal wire, the third metal wire extends from the cell area to the periphery area and is connected to the first metal wire, and the first metal wire, the second metal wire, and the third metal wire are configured as a wire for a reference line for sensing a logic state of the information storage devices.

19. The nonvolatile memory device of claim 15, wherein the information storage devices include magnetic random access memory (MRAM), the MRAM includes a cell transistor and a magnetic tunnel junction (MTJ) device, the MRAM includes a dummy MTJ device in an edge portion of the cell area adjacent to the periphery area, and the third metal wire is connected to the second metal wire in the edge portion through a vertical via, extends to the periphery area, and is connected to the first metal wire.

20. The nonvolatile memory device of claim 19, wherein an upper insulating layer including a first insulating layer and a second insulating layer are above the first metal wire, an upper surface of the second metal wire is coplanar with an upper surface of a first interlayer insulating layer and is covered by the upper insulating layer, the information storage devices are covered by a third insulating layer above the second insulating layer, and the dummy MTJ device is on the first insulating layer in the edge portion.

* * * * *